United States Patent
Su et al.

[11] Patent Number: 6,153,482
[45] Date of Patent: Nov. 28, 2000

[54] METHOD FOR FABRICATING LOCOS ISOLATION HAVING A PLANAR SURFACE WHICH INCLUDES HAVING THE POLISH STOP LAYER AT A LOWER LEVEL THAN THE LOCOS FORMATION

[75] Inventors: Lin-Chin Su, Taipei Hsien; Tzu-Ching Tsai, Taichung Hsien; Miin-Jiunn Jiang, Taipei; Hung-Chang Liao, Taipei Hsien; Jim Wang; Chung Min Lin, both of Taipei, all of Taiwan

[73] Assignee: Nanya Technology Corp., Taiwan

[21] Appl. No.: 09/174,091

[22] Filed: Oct. 16, 1998

[51] Int. Cl.[7] .................. H01L 21/331; H01L 21/76; H01L 21/302
[52] U.S. Cl. .................. 438/297; 438/431; 438/439; 438/446; 438/692
[58] Field of Search .................. 438/431, 446, 438/692, 297, 439

[56] References Cited

U.S. PATENT DOCUMENTS

| | | |
|---|---|---|
| 4,356,211 | 10/1982 | Riseman . |
| 5,246,537 | 9/1993 | Cooper et al. . |
| 5,252,503 | 10/1993 | Pasch . |
| 5,895,253 | 4/1999 | Akram . |

*Primary Examiner*—John F. Niebling
*Assistant Examiner*—Ron Pompey
*Attorney, Agent, or Firm*—Michael D. Bednarek; Shaw Pittman

[57] ABSTRACT

A method for fabricating LOCOS isolation having a planar surface. The method utilizes a polysilicon spacer to prevent bird beak. The method adds the steps of forming a polishing stop layer and removing said edge-protrusion portion of the local oxide by chemical mechanical polishing.

17 Claims, 5 Drawing Sheets

METHOD FOR FABRICATING LOCOS ISOLATION HAVING A PLANAR SURFACE WHICH INCLUDES HAVING THE POLISH STOP LAYER AT A LOWER LEVEL THAN THE LOCOS FORMATION

BACKGROUND OF THE INVENTION

1. Field of the Invention

The present invention relates to a method for fabricating local oxidation of silicon (LOCOS) isolation, and more particularly to a method for fabricating LOCOS isolation having a planar surface by means of chemical mechanical polishing (CMP).

2. Description of the prior art

To improve the bird beak at the edge of LOCOS isolation, a polysilicon spacer serving as a buffer layer is widely used in the LOCOS isolation process. Referring to FIGS. 1A through 1E, the cross-sectional side views of a conventional method for fabricating a LOCOS isolation are depicted in sequence.

Referring now to FIG. 1A, a cross-sectional view of the starting step is schematically shown. In FIG. 1A, a first pad oxide layer 12 and a silicon nitride layer 14 are sequentially formed on the active region of a silicon substrate 10. Then, using silicon nitride layer 14 as an etching mask, the silicon substrate 10 is etched to form a recess by anisotropic etching.

Next, as shown in FIG. 1B, a second pad oxide 16 is formed on the surface of the recess 15 by thermal oxidation, which preferably uses a gas containing $O_2$ as the reactive gas.

Now, as shown in FIG. 1C, a polysilicon spacer 18, which extends the recess 15, is formed on the side walls of the silicon nitride layer 14. The polysilicon spacer 18 can be formed by the steps of depositing a polysilicon layer and etching back the polysilicon layer. A thin silicon nitride layer 20 is deposited on the surface of the polysilicon spacer 18 by selectively chemical vapor deposition.

Referring now to FIGS. 1C and 1D, a local oxide 22 (isolation), which has edge-protrusion portion P (i.e, Mickey ears), is grown above the recess 15 by thermal oxidation.

Next, referring to FIG. 1E, the silicon nitride layer 14 is removed via wet etching to leave local oxide 22a.

However, the LOCOS isolation process suffers from the problem that as edge-protrusion portion P can cause an uneven surface.

SUMMARY OF THE INVENTION

In view of the above disadvantage, an object of the invention is to provide a method for fabricating LOCOS isolation having a planar surface by adding a polishing stop layer" forming step and a polishing step.

The above object is attained by providing a method for fabricating LOCOS isolation having a planar surface, which comprises the steps of: (a) forming a masking layer on the active region of a silicon substrate; (b) anisotropically etching said silicon substrate by using said masking layer as an etching mask, thereby forming a recess; (c) forming a polysilicon spacer on the side walls of said masking layer, said polysilicon spacer further extending said recess; (d) growing a local oxide having an edge-protrusion portion P above said recess by thermal oxidation; (e) selectively removing said masking layer to leave a portion of said masking layer serving as a polishing stop layer; and (f) removing said edge-protrusion portion P of the local oxide by chemical mechanical polishing, thereby leaving a LOCOS isolation having a planar surface.

Moreover, the above object is attained by providing a method for fabricating LOCOS isolation having a planar surface, which comprises the steps of: (a) forming a silicon nitride layer on the active region of a silicon substrate, said silicon nitride layer having a pad oxide grown thereunder; (b) anisotropically etching said silicon substrate by using said silicon nitride layer as an etching mask, thereby forming a recess; (c) forming a polysilicon spacer on the side walls of said silicon nitride layer, said polysilicon spacer further extending said recess; (d)forming a thin silicon nitride layer on said polysilicon spacer; (e) growing a local oxide having an edge-protrusion portion P above said recess by thermal oxidation; (f) selectively removing said silicon nitride layer to leave a portion of said silicon nitride layer serving as a polishing stop layer; and (g) removing said edge-protrusion portion P of the local oxide by chemical mechanical polishing, thereby leaving a LOCOS isolation having a planar surface.

An aspect of the invention is to provide the steps of etching the polishing stop layer and removing said edge-protrusion portion P of the local oxide by chemical mechanical polishing.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through FIG. 2G of the drawings.

Figure 1A:
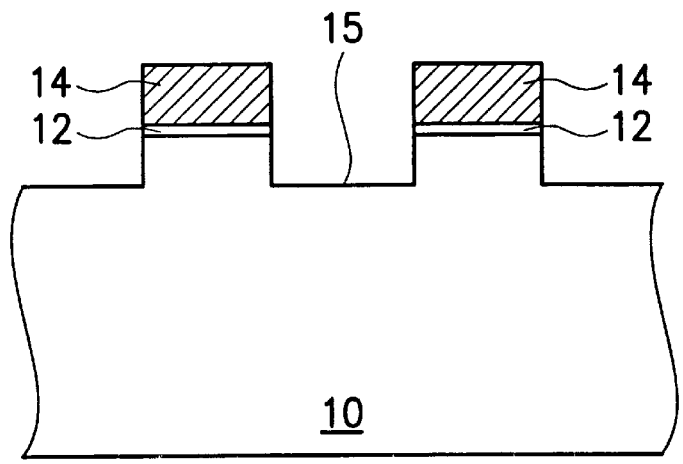
FIGS. 1A through 1E are cross-sectional side views showing the manufacturing steps of a LOCOS isolation of the prior art.
Figure 1B:
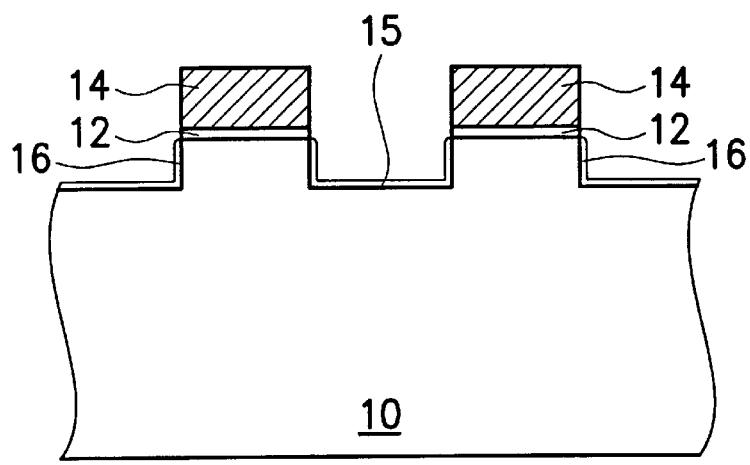
Figure 1C:
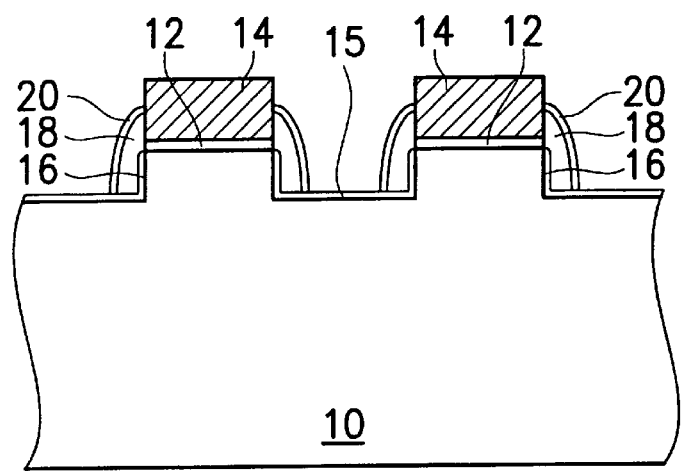
Figure 1D:
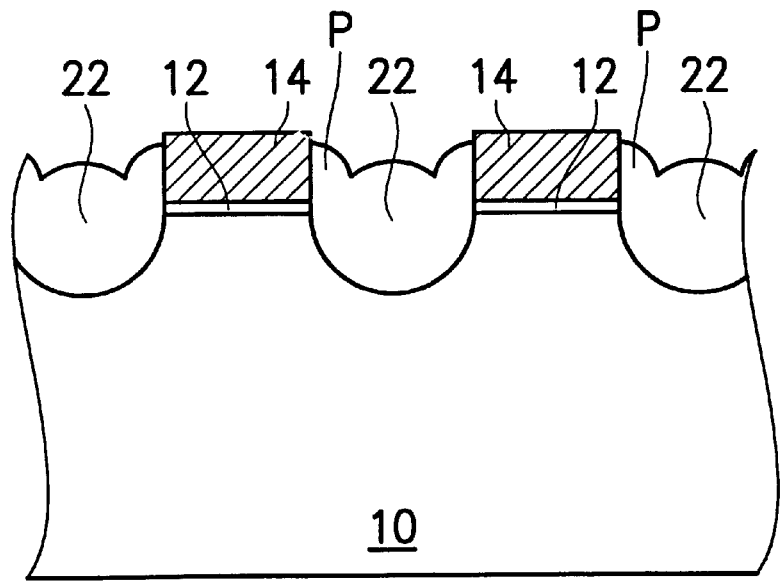
Figure 1E:
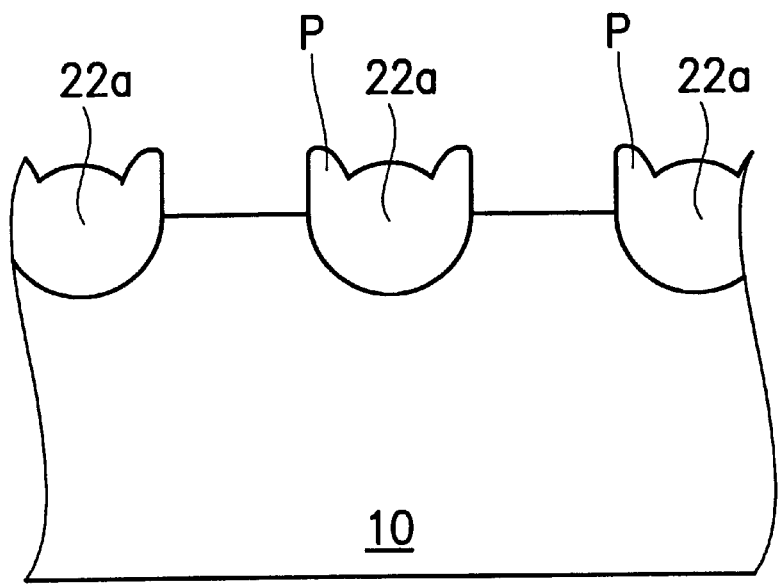
Figure 2A:
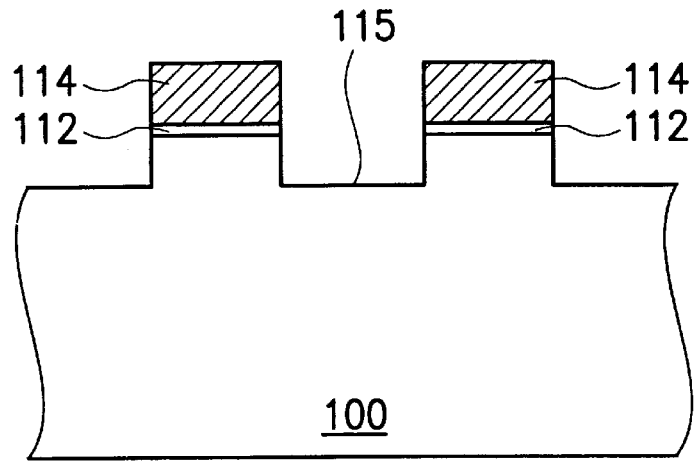
FIGS. 2A through 2G are cross-sectional side views showing the manufacturing steps of a LOCOS isolation having a planar surface of the invention.

Referring now to FIG. 2A, a cross-sectional view of the starting step is schematically shown. In FIG. 2A, a first pad oxide layer 112 and a masking layer 114, such as a silicon nitride layer having a thickness in the range of approximately 1200 to 1800 angstroms, are sequentially formed on the active region of a silicon substrate 100. The first pad oxide layer 112 has a thickness of approximately 160 angstroms. Then, using masking layer 114 as an etching mask, the silicon substrate 100 is etched to form a recess 115, having a depth of somewhere between 300 and 700 Angstroms, by anisotropic etching.

Figure 2B:
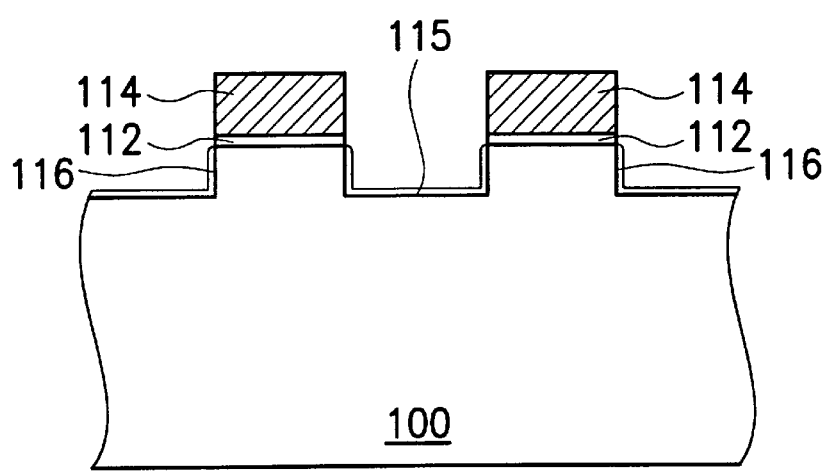

Next, as shown in FIG. 2B, a second pad oxide 116, having a thickness of approximately 100 Angstroms, is formed on the surface of the recess 115 by thermal oxidation, which preferably uses a gas containing $O_2$ as the reactive gas.

Figure 2C:
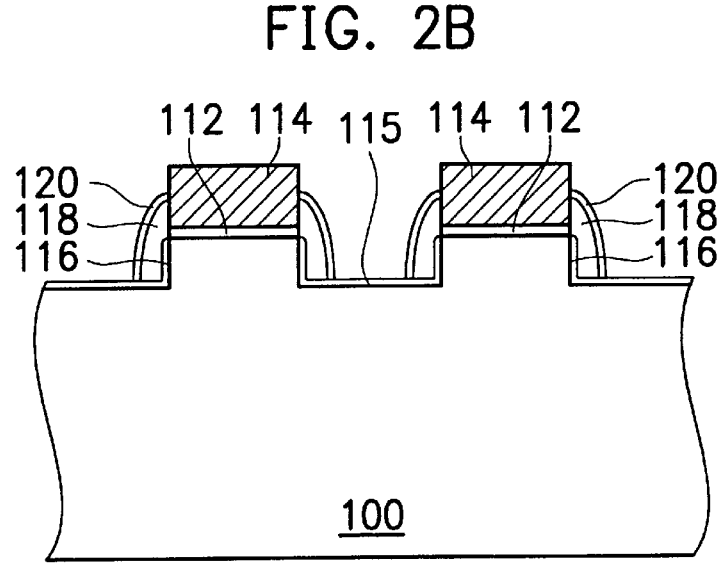

Now as shown in FIG. 2C, a polysilicon spacer 118,which extends the recess 115, is formed on the side walls of the masking layer 114. The polysilicon spacer 118 can be formed by the steps of depositing a polysilicon layer and etching back the polysilicon layer. A thin silicon nitride layer 120 having a thickness in the range of approximately 30 to 50 angstroms, is deposited on the surface of the polysilicon spacer 118 by selective chemical vapor deposition. Due to the deposition selectivity of the thin silicon nitride layer 120, the thin silicon nitride layer 120 is formed very thinly (not shown) on the second pad oxide 116.

Figure 2D:
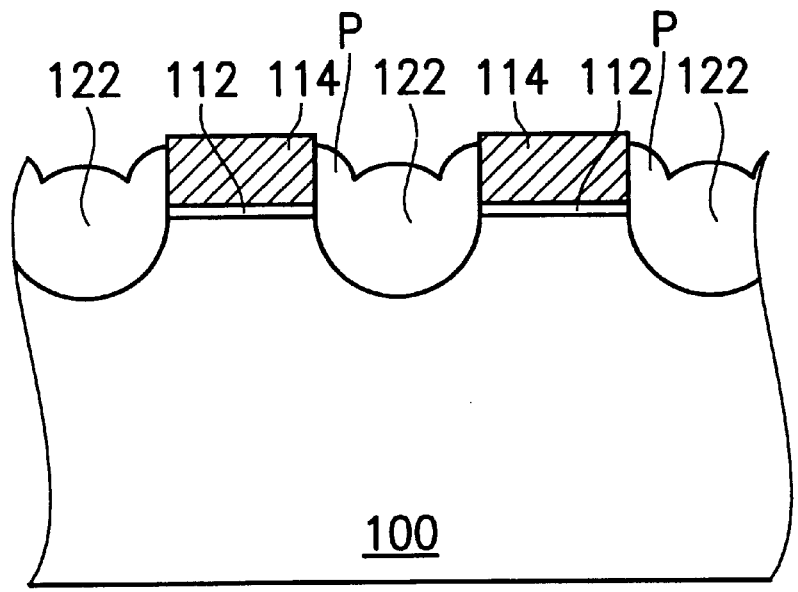

Referring now to FIGS. 2C and 2D, a local oxide 122 (field oxide), which has edge-protrusion portion P (i.e, Mickey ears), is grown above the recess 115 by thermal oxidation. The local oxide 122 is performed by thermal oxidation, which preferably uses a gas containing $H_2O$ and $O_2$ as the reactive gas.

Figure 2E:
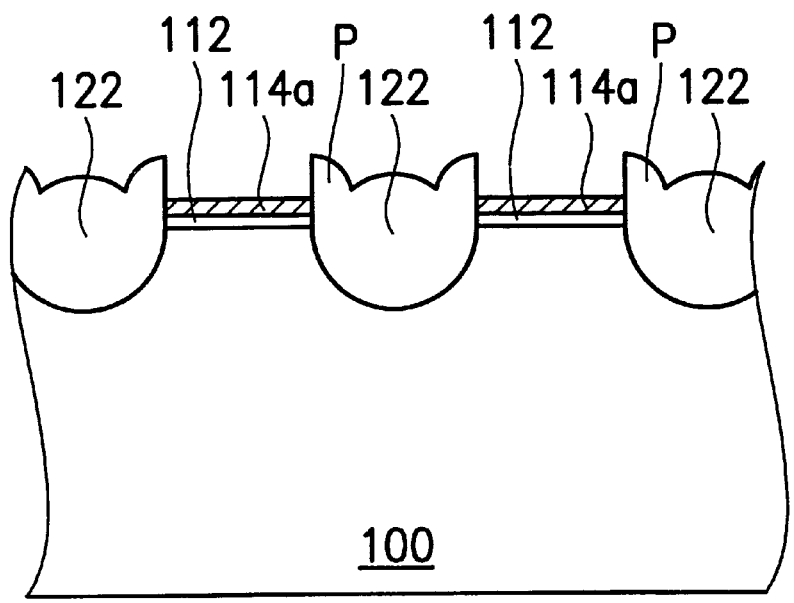

Next, referring to FIG. 2E, the masking layer 114 is selectively removed via wet etching to leave a portion of the masking layer serving as a polishing stop layer 114a. The wet etching can be accomplished by hot phosphoric acid solution, which has a silicon nitride etching velocity of about 45 angstroms per minute.

Figure 2F:
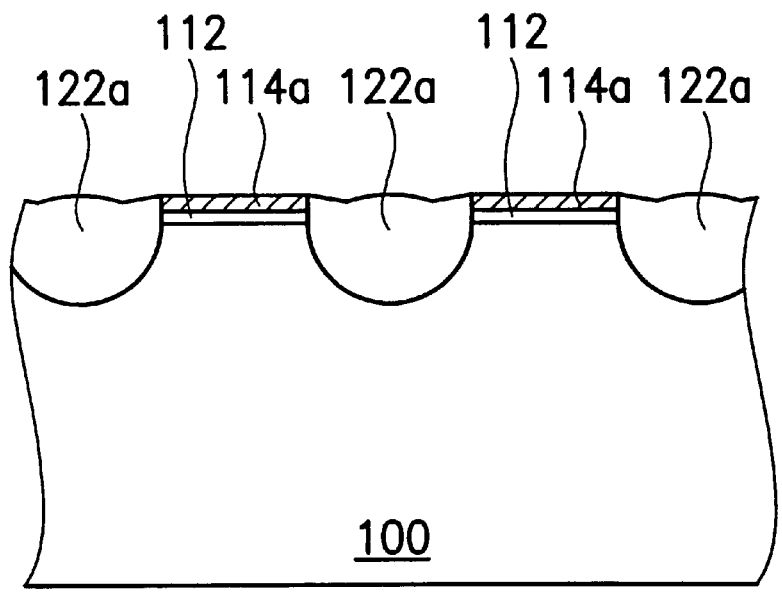

Now as shown in FIG. 2F, the edge-protrusion portion P of the local oxide 122 is removed, usually by chemical mechanical polishing (CMP) to leave local oxide 122. The CMP slurry has a selectivity ratio (oxide/nitride) of approximately 10.

Figure 2G:
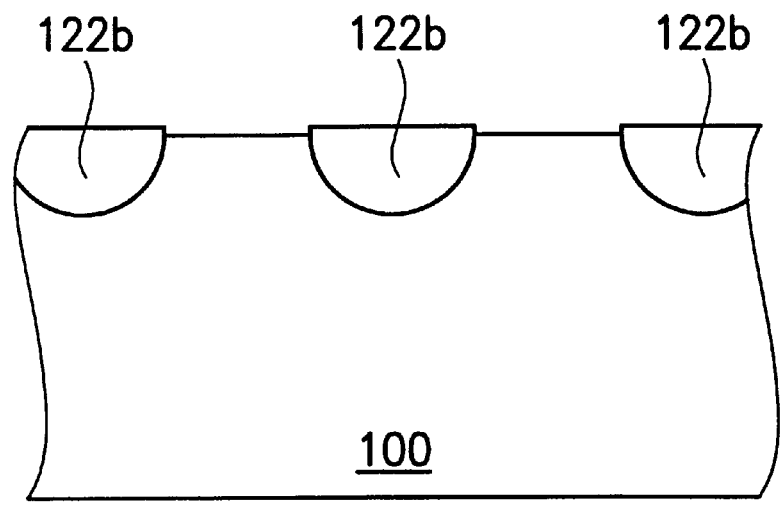

Afterwards, referring to FIG. 2G, the polishing stop layer 114a and the first pad oxide layer 112 are removed respectively by using phosphate etchant and hydrogen fluoride etchant, thereby leaving a local oxide 122b having a planar surface (serving as a LOCOS isolation).

An important advantage of the invention is the use of the polishing stop layer to smooth the LOCOS isolation by the chemical mechanical polishing technique. Therefore, the problems of the prior art can be eliminated.

What is claimed is:

1. A method for fabricating LOCOS isolation having a planar surface, comprising the steps of:
   (a) forming a masking layer on the active region of a silicon substrate;
   (b) anisotropically etching said silicon substrate by using said masking layer as an etching mask, thereby forming a recess;
   (c) forming a polysilicon spacer on the side walls of said masking layer, said polysilicon spacer further extending said recess;
   (d) growing a local oxide having an edge-protrusion portion above said recess by thermal oxidation;
   (e) selectively removing said masking layer to leave a portion of said masking layer serving as a polishing stop layer, and to leave said local oxide having said edge-protrusion portion; and
   (f) removing said edge-protrusion portion of the local oxide by chemical mechanical polishing, thereby leaving a LOCOS isolation having a planar surface,
   wherein said edge-protrusion portion of said local oxide is not removed before said removing step (step (f)).

2. A method as claimed in claim 1, wherein said masking layer is a silicon nitride layer.

3. A method as claimed in claim 2, wherein said silicon nitride layer has a thickness of somewhere between 1200 and 1800 Angstroms.

4. A method as claimed in claim 1, further comprising a step before step (a) of forming a first pad oxide layer by thermal oxidation.

5. A method as claimed in claim 4, further comprising a step after step (b) of forming a second pad oxide layer by thermal oxidation.

6. A method as claimed in claim 3, wherein said polishing stop layer has a thickness of somewhere between 400 and 800 Angstroms.

7. A method as claimed in claim 3, wherein said recess has a depth of somewhere between 300 and 700 Angstroms.

8. A method as claimed in claim 1, further comprising a step after step (f) of removing said polishing stop layer by wet etching.

9. A method as claimed in claim 1, wherein said masking layer of step (e) is selectively removed by wet etching.

10. A method for fabricating LOCOS isolation having a planar surface, comprising the steps of:
    (a) forming a silicon nitride layer on the active region of a silicon substrate, said silicon nitride layer having a pad oxide grown thereunder;
    (b) anisotropically etching said silicon substrate by using said silicon nitride layer as an etching mask, thereby forming a recess;
    (c) forming a polysilicon spacer on the side walls of said silicon nitride layer, said polysilicon spacer further extending said recess;
    (d) growing a thin silicon nitride layer on said polysilicon spacer;
    (e) growing a local oxide having an edge-protrusion portion above said recess by thermal oxidation;
    (f) selectively removing said silicon nitride layer to leave a portion of said silicon nitiride layer serving as a polishing stop layer, and to leave said local oxide having said edge-protrusion portion; and
    (g) removing said edge-protrusion portion of the local oxide by chemical mechanical polishing, thereby leaving a LOCOS isolation having a planar surface,
    wherein said edge-protrusion portion of said local oxide is not removed before said removing step (step (g)).

11. A method as claimed in claim 10, wherein said silicon nitride layer formed in step (a) has a thickness of somewhere between 1200 and 1800 Angstroms.

12. A method as claimed in claim 10, further comprising a step after step (b) of forming a thin oxide layer on the surface of said recess by thermal oxidation.

13. A method as claimed in claim 11, wherein said thin silicon nitride layer has a thickness of somewhere between 30 and 50 Angstroms.

14. A method as claimed in claim 11, wherein said polishing stop layer formed in step (f) has a thickness of somewhere between 400 and 800 Angstroms.

15. A method as claimed in claim 11, wherein said recess formed in step (b) has a depth of somewhere between 300 and 700 Angstroms.

16. A method as claimed in claim 10, further comprising a step after step (g) of removing said polishing stop layer by wet etching.

17. A method as claimed in claim 10, wherein said silicon nitride layer of step (f) is selectively removed by wet etching.

* * * * *